United States Patent
Oohiraki et al.

(10) Patent No.: US 9,579,739 B2
(45) Date of Patent: Feb. 28, 2017

(54) MANUFACTURING METHOD OF POWER-MODULE SUBSTRATE

(71) Applicant: MITSUBISHI MATERIALS CORPORATION, Tokyo (JP)

(72) Inventors: Tomoya Oohiraki, Kitamoto (JP); Sotaro Oi, Kitamoto (JP); Kimihito Nishikawa, Kitamoto (JP); Hiromasa Hayashi, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/768,041

(22) PCT Filed: Feb. 28, 2014

(86) PCT No.: PCT/JP2014/055088
§ 371 (c)(1),
(2) Date: Aug. 14, 2015

(87) PCT Pub. No.: WO2014/136683
PCT Pub. Date: Sep. 12, 2014

(65) Prior Publication Data
US 2016/0001388 A1    Jan. 7, 2016

(30) Foreign Application Priority Data

Mar. 7, 2013    (JP) .................................. 2013-045999

(51) Int. Cl.
*B23K 31/02* (2006.01)
*H01L 23/48* (2006.01)
(Continued)

(52) U.S. Cl.
CPC ............ *B23K 1/0016* (2013.01); *B23K 31/02* (2013.01); *C04B 35/645* (2013.01);
(Continued)

(58) Field of Classification Search
CPC .................................................. B23K 2201/42
(Continued)

(56) References Cited

U.S. PATENT DOCUMENTS

2007/0297162 A1    12/2007  Negishi et al.
2013/0187293 A1*   7/2013   Sakai ............... H01L 21/76254
                                                        257/778

FOREIGN PATENT DOCUMENTS

JP    06-216499 A    8/1994
JP    09-157628 A    6/1997
(Continued)

OTHER PUBLICATIONS

International Search Report mailed Jun. 10, 2014, issued for PCT/JP2014/055088.

*Primary Examiner* — Erin Saad
(74) *Attorney, Agent, or Firm* — Locke Lord LLP

(57) ABSTRACT

A method of manufacturing power-module substrates, after bonding copper-circuit plates 30 at intervals on a ceramic plate 21 having an area in which ceramic substrates can be formed abreast, by dividing the ceramic plate 21 between the copper-circuit plates 30, in which: bonding-material layers 71 of active-metal brazing material having same shapes as outer shapes of the copper-circuit plates 30 are formed on the ceramic plate 21; temporal-stick material 72 including polyethylene glycol as a major ingredient is spread on the copper-circuit plates 30, the bonding-material layers 71 and the copper-circuit plates 30 are temporarily fixed on the ceramic plate 21 in a state of laminating with positioning by the temporal-stick material 72; and a laminated assembly thereof is pressurized in a laminating direction and heated, so that the ceramic plate and the copper-circuit plates are bonded.

4 Claims, 8 Drawing Sheets

(51) Int. Cl.
  *B23K 1/00*     (2006.01)
  *C04B 35/645*   (2006.01)
  *C04B 37/02*    (2006.01)
  *H01L 21/48*    (2006.01)
  *H01L 23/373*   (2006.01)
  *H05K 1/02*     (2006.01)
  *H05K 3/20*     (2006.01)

(52) U.S. Cl.
  CPC ........ *C04B 37/026* (2013.01); *H01L 21/4846* (2013.01); *H01L 21/4882* (2013.01); *H05K 3/207* (2013.01); *C04B 2237/121* (2013.01); *C04B 2237/125* (2013.01); *C04B 2237/126* (2013.01); *C04B 2237/127* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/407* (2013.01); *C04B 2237/62* (2013.01); *C04B 2237/704* (2013.01); *C04B 2237/706* (2013.01); *C04B 2237/708* (2013.01); *C04B 2237/86* (2013.01); *H01L 23/3735* (2013.01); *H01L 2924/0002* (2013.01); *H05K 1/0263* (2013.01); *H05K 3/202* (2013.01); *H05K 2203/04* (2013.01); *H05K 2203/06* (2013.01)

(58) Field of Classification Search
  USPC ................................ 228/123.1; 257/E23.106
  See application file for complete search history.

(56) References Cited

FOREIGN PATENT DOCUMENTS

| | | |
|---|---|---|
| JP | 11-238961 A | 8/1999 |
| JP | 2010-050164 A | 3/2010 |

* cited by examiner

FIG. 13

| | SIDE SLIDE | PASTE SEPARATION | Cu/AlN BONDABILITY | |
|---|---|---|---|---|
| WITHOUT TEMPORAL-STICKING MATERIAL | × | ○ | ○ | |
| PEG | ○ | ○ | ○ | |
| INSTANT GLUE (3000RX) | ○ | × | × | |
| RESIN SHEET (BR101) | ○ | ○ | △ | |
| GLYCEROL | × | ○ | × | |
| LIQUID PARAFFIN | × | ○ | △ | | ant

MANUFACTURING METHOD OF POWER-MODULE SUBSTRATE

Priority is claimed on Japanese Patent Application No. 2013-45999, filed Mar. 7, 2013, the content of which is incorporated herein by reference.

BACKGROUND OF THE INVENTION

Field of the Invention

The present invention relates to a manufacturing method of a power-module substrate for a semiconductor device controlling a large electric current and high voltage.

Description of the Related Art

Conventionally, it is known that a power-module substrate has a structure in which a circuit plate is bonded with laminating on one surface of a ceramic substrate and a heat-radiation plate is bonded with laminating on the other surface of the ceramic substrate. The power-module substrate is provided as a power module by soldering electronic components such as a semiconductor chip (a power element) and the like on the circuit plate and bonding a heat sink on the heat-radiation plate.

In such power-module substrates, for example, there is technology described in Patent Document 1 and Patent Document 2 as methods of bonding metal plates to be the circuit plate or the heat-radiation plate on the ceramic substrate by laminating.

Patent Document 1 discloses steps in which: adjusting a copper-circuit assembly in a state in which circuit elements are connected by thin bridge portions; printing bonding material such as Ag—Cu—Ti or the like including active metals such as Ti on a ceramic substrate in a pattern of the copper-circuit assembly; bonding the copper-circuit assembly and the ceramic substrate by heating with laminating; and then removing the bridge portions by an etching process.

Patent Document 2 discloses a method of manufacturing power-module substrates, including steps of: laminating and bonding a ceramic mother-plate and a metal plate with interposing a brazing foil; forming circuit patterns by etching the metal plate; forming grooves between the circuit patterns on the ceramic mother-plate; and dividing the ceramic mother-plate along the grooves.

PRIOR ART DOCUMENTS

Patent Documents

Patent Document 1: Japanese Unexamined Patent Application, First Publication No. H06-216499
Patent Document 2: Japanese Unexamined Patent Application, First Publication No. 2010-50164

SUMMARY OF THE INVENTION

Problems to be Solved by the Invention

It is possible to manufacture a plurality of power-module substrates by these methods having excellent mass productivity, the power-module substrates can be manufactured. However, by bonding the ceramic substrate and the metal plate both having large area so as to form the power-module substrates abreast, the bonding material is spread to the other part than the circuit elements. When the metal plate is copper, the bonding is performed by an active-metal method. In the spread part, it is difficult to remove the bonding material by the etching or the like since the bonding material includes Ag.

In this case, it is possible that the metal plate is divided into pieces in advance and the brazing material having a pattern of the shape along shapes of the pieces is used; though, it is necessary to prevent deviation in processes of laminating, pressurizing and heating.

The present invention is achieved in consideration of the above circumstances, and has an object to provide a method in which a plurality of power-module substrates can be efficiently manufactured by preventing positioning deviation between a ceramic plate, bonding material and a copper-circuit plate when the copper-circuit plate is bonded to the ceramic plate by an active-metal brazing method.

Means for Solving the Problem

A manufacturing method of power-module substrate according to the present invention is a method in which copper-circuit plates are bonded at intervals on a ceramic plate having an area wherein ceramic substrates can be formed abreast, and then the ceramic plate is divided between the copper-circuit plates so as to manufacture the power-module substrates, having: a laminating step of forming bonding-material layers of active-metal brazing material having same shapes as outer shapes of the copper-circuit plates on one of the ceramic plate or the copper-circuit plates, spreading temporal-stick material including polyethylene glycol as a major ingredient on the other of the ceramic plate or the copper-circuit plates, and temporary sticking the bonding-material layers and the copper-circuit plates in a state of laminating with positioning on the ceramic plate by the temporal-stick material; and a bonding step of bonding the ceramic plate and the copper-circuit plates by pressurizing and heating a laminated assembly thereof in a laminating direction.

In this manufacturing method, since the copper-circuit plates and the ceramic plate are temporarily stuck together with interposing the bonding-material layers by the temporal-stick material including polyethylene glycol as a major ingredient, the copper-circuit plates and the bonding-material layers are not slid on the ceramic plate in the following bonding step, so that these are maintained to be positioned. Accordingly, the bonding material can be prevented from spreading out of the copper-circuit plates.

Polyethylene glycol is solid at normal temperature and melts by heating since it is a highly-polymerized compound having a low melting point; so it is easy to be spread on the ceramic plate or the copper-circuit plates, and it is possible to stick the ceramic plate and the copper-circuit plates with interposing the bonding-material layers by solidifying the polyethylene glycol by cooling to the normal temperature. Furthermore, it immediately resolves in the bonding step before reaching bonding temperature, so that there is no influence on bonded surfaces.

In the manufacturing method of power-module substrate according to the present invention, the bonding-material layers may be formed by spreading a paste on a surface of the ceramic plate; and the copper-circuit plates in which the temporal-stick material is spread may be laminated respectively on the bonding-material layers on the ceramic plate in the laminating step.

Active metals such as Ti and the like in the active-metal brazing material reacts N, O, or C in ceramics. Therefore, if the active-metal brazing material is spread on the ceramic plate, wettability to the ceramic plate is higher, so that the bondability is higher.

In the manufacturing method of power-module substrate according to the present invention, at least one or more of the copper-circuit plates may be formed by connecting circuit elements by bridge portions, and back surfaces of the bridge portions may be formed as recessed portions from back surfaces of the circuit elements.

It is possible to bond the circuit elements all together. The bonding material is prevented from spreading out from the bonding surfaces since the back surfaces of the bridge portions are recessed from the back surfaces (i.e., the bonding surfaces) of the circuit elements. Furthermore, since the circuit elements are connected by the bridge portions, it is possible to position and laminate the circuit elements all together on the ceramic plate.

Effects of the Invention

According to the manufacturing method of power-module substrate of the present invention, by temporarily sticking copper-circuit plates and a ceramic plate with interposing a bonding-material layer by temporal-bonding material including polyethylene glycol as a major ingredient: subsequent handling is easy; productivity is improved; it is possible to bond the elements in a state of being accurately positioned; and bonding material is prevented from spread out from the copper-circuit plates. Accordingly, it is possible to manufacture a power-module substrate having high commercial value.

BRIEF DESCRIPTION OF THE DRAWING

FIG. 13 is a table showing an evaluation result of bonding using various temporal-stick materials.

DETAILED DESCRIPTION OF THE INVENTION

Below, a manufacturing method of power-module substrate with a heat sink according to embodiments of the present invention will be explained.

Figure 6:
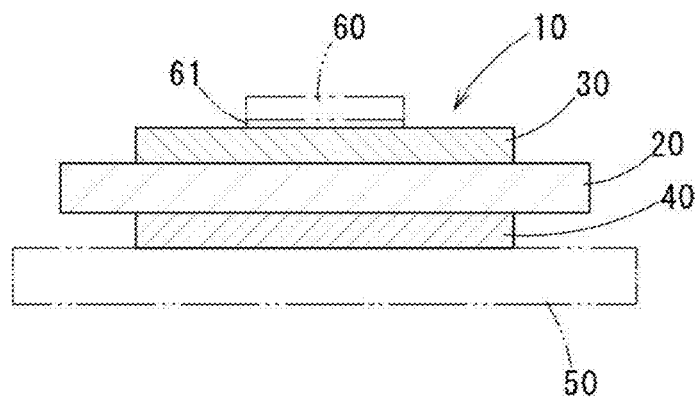
FIG. 6 is a sectional view of a power-module substrate obtained by the method of the first embodiment.

A power-module substrate manufactured by a manufacturing method of a first embodiment will be explained. As shown in FIG. 6, a power-module substrate 10 includes: a ceramic substrate 20; a copper-circuit plate 30 bonded on one surface of the ceramic substrate 20; and a heat-radiation plate 40 bonded on an opposite surface of the ceramic substrate 20. In this case, the ceramic substrate 20 and the heat-radiation plate 40 are formed to have square-flat shapes; and the copper-circuit plate 30 is formed to have a desired circuit pattern.

The power-module substrate 10 configures a power module as shown by two-dotted lines in FIG. 6: a heat sink 50 is bonded on an opposite surface of the heat-radiation plate 40 to the ceramic substrate 20; an electronic component 60 such as a semiconductor chip or the like is bonded on the copper-circuit plate 30 by a soldering layer 61; and the electronic component 60 and the copper-circuit plate 30 are connected by a bonding wire (not illustrated). Moreover, the whole of the power module is sealed by mold resin (not illustrated) if necessary. The soldering layer 61 is made from, for example, Sn—Cu based solder, Sn—Ag—Cu based solder, Zn—Al based solder, Pb—Sn based solder, or the like.

The ceramic substrate 20 is made from nitride-based ceramics such as MN (aluminum nitride), $Si_3N_4$ (silicon nitride) or the like, or oxide-based ceramics such as $Al_2O_3$ (alumina) or the like as a base material and has a square-shape. A thickness of the ceramic substrate 20 is set to 0.3 mm to 1.0 mm.

The copper-circuit plate 30 is formed of pure copper such as oxygen-free copper, tough-pitch copper and the like or copper alloy (simply called "copper" in this invention) to have a desired circuit pattern by stamping out a plate material by a press. A thickness of the copper-circuit plate 30 is set to 0.3 mm to 4 mm. The copper-circuit plate 30 is, as described below, bonded on the ceramic substrate by bonding material made from active-metal brazing material such as Ag—Ti, Ag—Ti—Cu and the like including active metals such as Ti or the like.

The heat-radiation plate 40 is made from pure aluminum having purity of 99.90% or higher or aluminum alloy (simply called "aluminum") and formed to have a thickness of 0.5 mm to 2 mm and a square-flat plate, which is ordinary smaller than the ceramic substrate 20. The heat-radiation plate 40 is bonded on the ceramic substrate 20 by bonding material such as Al—Si based brazing material, Al—Ge based brazing material, Al—Cu based brazing material, Al—Mg based brazing material, Al—Mn based brazing material or the like. The heat-radiation plate 40 may be made from pure aluminum having purity of 99.99% or higher.

Next, a manufacturing method of the power-module substrate 10 configured above will be explained. A ceramic plate 21 is prepared to have an area in which the ceramic substrates 20 can be formed abreast. The copper-circuit plates 30 and the heat-radiation plates 40 are prepared to have product dimensions used for the respective power-module substrate 10. First, the copper-circuit plates 30 are placed on one surface of the ceramic plate 21 and laminated. Laminated assemblies thereof are pressurized and heated so as to be bonded. Then, the heat-radiation plates 40 are bonded on an opposite surface of the ceramic plate 21 respectively. After that, the ceramic plate 21 is divided so as to make pieces of the power-module substrates 10. Below, it will be described in detail in order of steps.

Laminating Step of Copper-Circuit Plate

Figure 1:
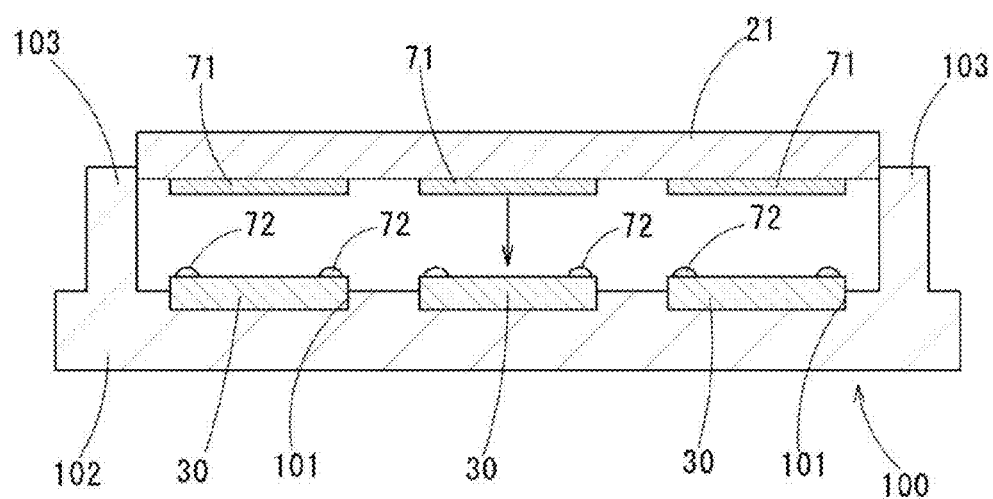
FIG. 1 is a sectional view schematically showing a middle state in which a ceramic plate in which bonding-material layers are formed on one surface thereof and copper-circuit plates on which temporal-stick material is adhered are laminated in a first embodiment of a manufacturing method of power-module substrate according to the present invention.

In this laminating step of copper-circuit plate, as shown in FIG. 1, a positioning tool 100 is used for support of positioning when the copper-circuit plates 30 and the ceramic plate 21 are piled. The positioning tool 100 is provided with: a base table 102 having recessed portions 101 for arranging the copper-circuit plates 30; and guide walls 103 guiding the ceramic plate 21 with positioning with respect to the copper-circuit plates 30 arranged in the recessed portions 101.

The recessed portions 101 have a depth smaller than the thickness of the copper-circuit plates 30 and are arranged on an upper surface of the base table 102 at intervals respectively. By fitting the copper-circuit plates 30 into the recessed portions 101, the copper-circuit plates 30 are arranged horizontally so that upper surfaces thereof are in a same plane.

The guide walls 103 are formed to stand on the upper surface of the base table 102 at three positions for example, surrounding an arranged area of the recessed portions 101 from three sides. Inner side faces of these guide walls 103 are formed along a vertical direction, so that three sides of the square ceramic plate 21 are in contact with these inner side surfaces, and the ceramic plate 21 is guided vertically. It is sufficient that the guide walls 103 are formed to guide at least two sides orthogonally crossing at one of corners of the ceramic plate 21.

In advance of the laminating step, bonding-material layers 71 are formed by spreading paste of active-metal brazing material on one surface of the ceramic plate 21.

The active-metal brazing material is made as paste by blending: metal powder including Ag and active metals (e.g., Ti); organic binder such as ethyl cellulose, methyl cellulose, polymethyl methacrylate, acrylic resin, alkyd resin and the like; a solvent such as toluene, cyclohexanon, diaceton alcohol, methyl cellosolve, ethyl cellosolve, terpineol, texanol, triethyl citrate and the like; a dispersing agent; plasticizer; a reducing agent and the like. As the metal powder, Ag-8.8% by mass of Ti, and Ag-27.4% by mass of Cu-2.0% by mass of Ti are used preferably.

The active-metal brazing material is spread by screen printing or the like on the surface of the ceramic plate 21 so as to follow intended positions of bonding the copper-circuit plates 30 and then dried, so that the bonding-material layers 71 having shape patterns which are same as outer shapes of the copper-circuit plates 30 are formed on the surface of the ceramic plate 21. The active-metal brazing material becomes porous material by drying. Accordingly, the bonding-material layers 71 are porous material having a lot of pores.

Meanwhile, temporal-stick material 72 including polyethylene glycol (PEG) as a major ingredient is applied on one surface of each of the copper-circuit plates 30. Polyethylene glycol is solid at normal temperature (25° C.) and phase thereof is transformed to liquid at relatively a low melting point. It is desirable to have a weight-average molecular of 800 to 20,000. If the weight-average molecular is lower than 800, since it is liquid under the normal temperature, it is difficult to handle if the weight-average molecular is higher than 20,000, since the melting point is high, applying workability on the copper-circuit plates 30 is deteriorated. If the weight-average molecular is 800 to 1,000, the melting point is about 40° C. Even if the weight-average molecular is 6,000, the melting point is about 60° C.

The temporal-stick material 72 is melt by heating, and applied on the surfaces of the copper-circuit plates 30 by dripping on several points such as corners of the copper-circuit plates 30 for example.

Next, the copper-circuit plates 30 on which the temporal-stick material 72 is applied are arranged in the recessed portions 101 of the positioning tool 100 in a state in which the temporal-stick material 72 faces upward. The temporal-stick material 72 may be dripped on the copper-circuit plates 30 arranged in the positioning tool 100.

Then, the temporal-stick material 72 is melt by heating the base table 102 of the positioning tool 100 or by the other operation, then the ceramic plate 21 on which the bonding-material layers 71 are formed is guided along the guide walls 103 and laminated on the temporal-stick material 72, so that the copper-circuit plates 30 and the ceramic plate 21 are laminated with being positioned to each other.

Figure 2:
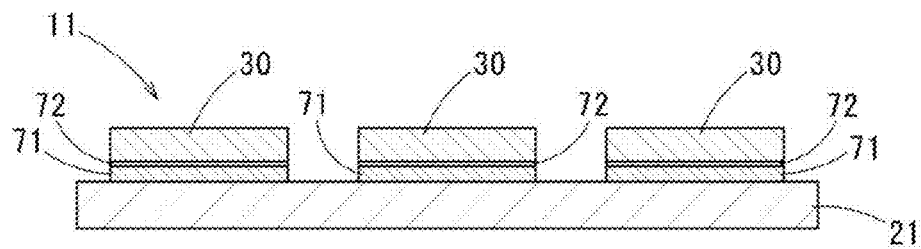
FIG. 2 is a sectional view schematically showing a state in which the copper-circuit plates are laminated on the ceramic plate, subsequent to the state shown in FIG. 1.

FIG. 2 shows a state in which the ceramic plate 21 and the copper-circuit plates 30 are laminated (which are shown by a vertically inverse state of FIG. 1). The temporal-stick material 72 adhered on the copper-circuit plates 30 is thinned and layered between the copper-circuit plates 30 and the bonding-material layers 71 by laminating, and moves into the pores of the bonding-material layers 71 which are porous material, so that both are bonded together. In this case, the bonding-material layers 71 and the copper-circuit plates 30 are formed to have the same outer shapes, so that these are laminated in a state of accurately positioned without shifting. The temporal-stick material 72 is solidified by cooling to the normal temperature, so that laminated assemblies 11 of the copper-circuit plates 30 and the ceramic plate 21 are maintained in a state of being positioned.

In addition, for mass production or the like, it may be adopted that: the copper-circuit plates 30 on which the temporal-stick material 72 is applied are prepared in advance by once cooling the temporal-stick material 72 dripped on the copper-circuit plates 30 to the normal temperature so as to be solidified; and when these copper-circuit plates 30 are laminated on the ceramic plate 21, the copper-circuit plates 30 are heated in sequence so as to re-melt the temporal-stick material 72, and then laminated on the ceramic plate 21.

Copper-Circuit Plate Bonding Step

Figure 3:
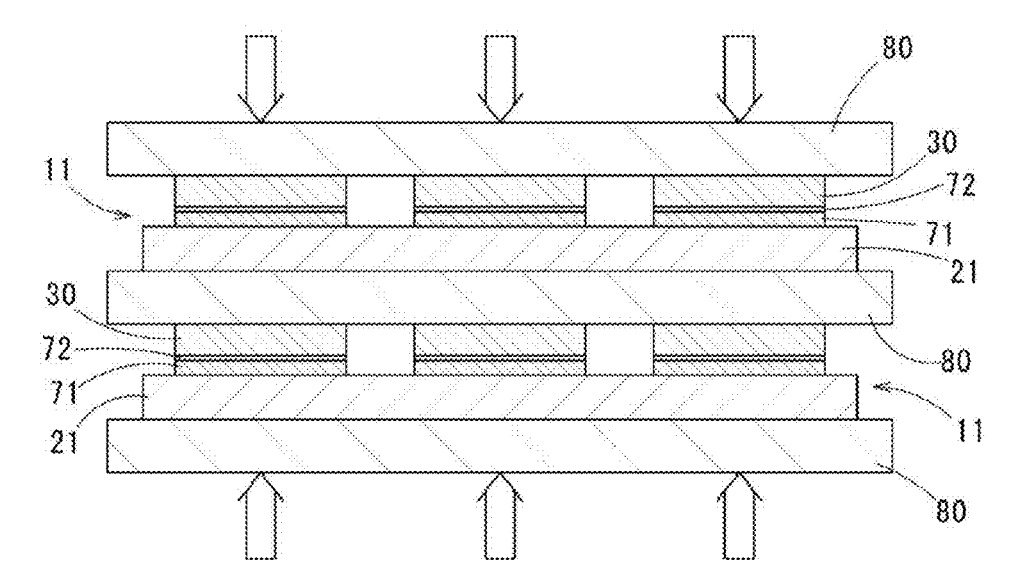
FIG. 3 is a sectional view schematically showing a bonding step of the ceramic plates and the copper-circuit plates which are laminated as shown in FIG. 2 in a state in which sets of the ceramic plate and the copper-circuit plates are stacked.

The laminated assemblies 11 of the ceramic plates 21 and the copper-circuit plates 30 are stacked with interposing cover plates 80 and pressurized in a laminating direction in which the laminated assemblies 11 are stacked as shown in FIG. 3, and heated in a vacuum with pressurizing: so that the ceramic plates 21 and the copper-circuit plates 30 are bonded by the bonding-material layers 71 therebetween. Since the active metal is included in the bonding-material layers 71, when heated in the vacuum, nitride and oxide are generated on the surface of the ceramic plates 21 by reacting of Ti that is active metal with N and O included in the ceramic plates 21. Furthermore, melted-metal layer is formed by reacting of Ag with Cu in the copper-circuit plates 30, so that the copper-circuit plates 30 and the ceramic plates 21 are bonded together by an Ag—Cu eutectic composition layer by cooling and solidifying the melted-metal layer.

Specifically, the laminated assemblies 11 of the ceramic plates 21 and the copper-circuit plates 30 are pressurized in the vacuum of $1 \times 10^{-3}$ Pa in the laminating direction by a pressure of 10 N/cm$^2$ (1 kgf/cm$^2$) to 334 N/cm$^2$ (35 kgf/cm$^2$). The cover plates 80 are made of carbon so as not to be adhered to the copper-circuit plates 30 or the ceramic plates 21 while the bonding step. Then, the whole laminated assemblies 11 in the pressurized state are put into a vacuum heating furnace, heated for 10 minutes or longer at 790° C. to 850° C., and then cooled. The temporal-stick material 72 is decomposed and disappeared initially in this heating process.

By this copper-circuit plate bonding step, a bonded body 12 in which the copper-circuit plates 30 are bonded on the ceramic plate 21 is made.

Heat-Radiation Plate Bonding Step

The heat-radiation plates 40 are bonded on the ceramic plate 21 by bonding material 73 as Al—Si based brazing material, Al—Ge based brazing material, Al—Cu based brazing material, Al—Mg based brazing material, Al—Mn based brazing material or the like. It is desirable to use Al—Si based brazing material including Si which is a melting point depression element in a foil shape with thickness of 5 µm to 50 µm.

As a bonding method, the heat-radiation plates 40 and the ceramic plate 21 may be laminated with interposing the bonding material (a brazing foil) 73. Alternatively, a method may be adopted such as: in order to form the heat-radiation plates 40, an aluminum plate on which the bonding material 73 is temporarily fixed by welding or the like is punched out by a press so that the heat-radiation plates 40 on which the bonding material 73 is temporary fixed are formed; and these heat-radiation plates 40 are laminated on the ceramic plates 21 at a surface of the bonding material 73. Also in the laminating process of the heat-radiation plates 40, a positioning tool as shown in FIG. 1 may be used.

Figure 4:
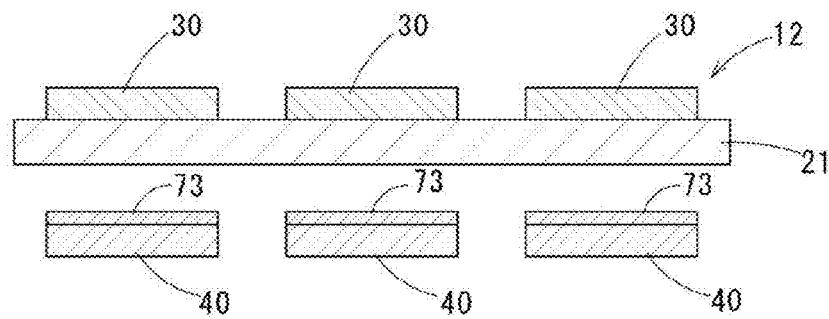
FIG. 4 is a sectional view schematically showing a middle state of laminating heat-radiation plates on an opposite surface of the ceramic plate after the bonding step shown in FIG. 3.

The heat-radiation plates 40 each are stacked on a surface opposite to the bonding side of the copper-circuit plates 30 on the ceramic plate 21 so as to overlap with the bonding positions of the copper-circuit plate 30 as shown in FIG. 4. Similarly to the above-mentioned copper-circuit plate bonding step, layered bodies on which the heat-radiation plates 40 are laminated are stacked, and heated in a vacuum heating furnace with pressurizing in a laminating direction; so that the heat-radiation plates 40 are bonded to the ceramic plate 21 by melting, cooling and solidifying the bonding material (brazing material) 73 and a part of aluminum in the heat-radiation plates 40. Pressurizing force is set to 10 N/cm$^2$ (1 kgf/cm$^2$) to 334 N/cm$^2$ (35 kgf/cm$^2$). Heating temperature is set to 550° C. to 650° C. Similarly to the copper-circuit bonding step, the cover plates 80 made of carbon are used for pressurizing.

Figure 5:
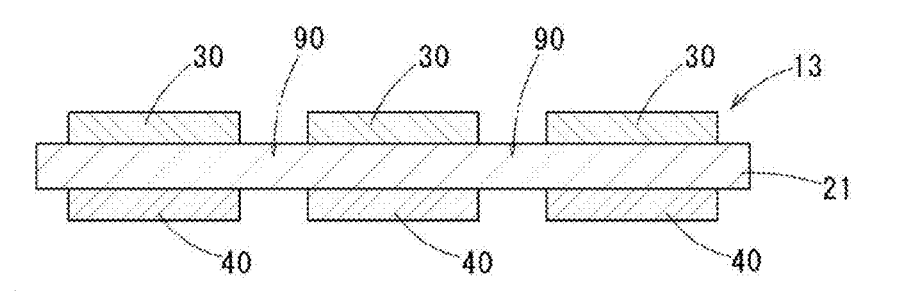
FIG. 5 is a sectional view schematically showing a state in which the heat-radiation plates are bonded on the ceramic plate, subsequent to the state shown in FIG. 4.

By performing the heat-radiation plate bonding step, as shown in FIG. 5, a bonded body 13 in which the copper-circuit plates 30 are bonded on one surface of the ceramic plate 21 and the heat-radiation plates 40 are bonded on the opposite surface is obtained.

Dividing Step

Grooves 90 are formed between the copper-circuit plates 30 on the ceramic plate 21 as shown by dotted lines in FIG. 5 by a laser beam machining. Then, dividing the ceramic plate 21 along the grooves 90, the power-module substrates 10 in which the copper-circuit plate 30 is bonded on one surface of the ceramic substrate 20 and the heat-radiation plate 40 is bonded on the opposite surface of the ceramic substrate 20 respectively are formed as shown in FIG. 6. The grooves 90 of the ceramic plate 21 may be formed before bonding the copper-circuit plates 30.

In the power-module substrate 10 manufactured as above, temporarily sticking the copper-circuit plates 30 to the bonding-material layers 71 on the ceramic plate 21 by the temporal-stick material 72 in the copper-circuit plate laminating step before the copper-circuit plate bonding step, it is prevented that the copper-circuit plates 30 and the ceramic plate 21 are moved from the bonding-material layers 71 in the bonding operation or the like in the subsequent copper-circuit plate bonding step. Accordingly, it is possible to bond the copper-circuit plates 30 to the prescribed positions on the ceramic plate 21 in a state of being accurately positioned.

Figure 7:
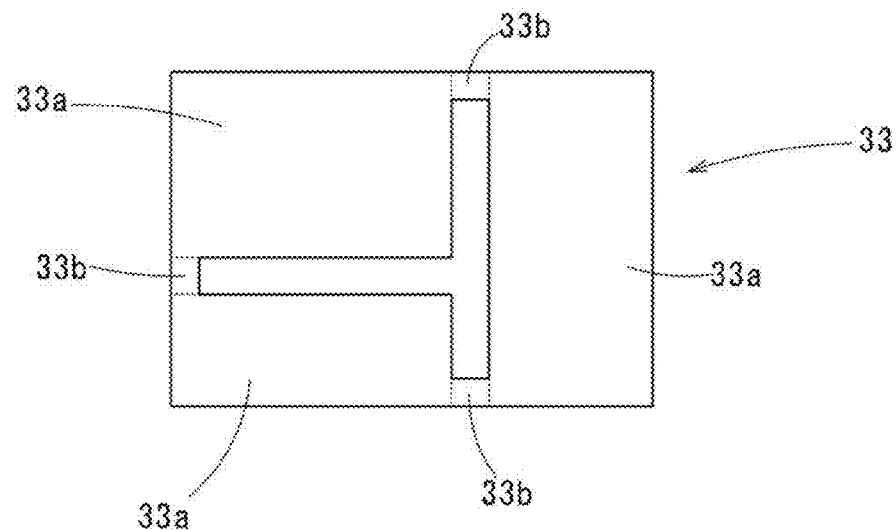
FIG. 7 is a plan view of an example of a copper-circuit plate formed by connecting circuit elements by bridge portions in a method of a second embodiment according to the present invention.
Figure 8:
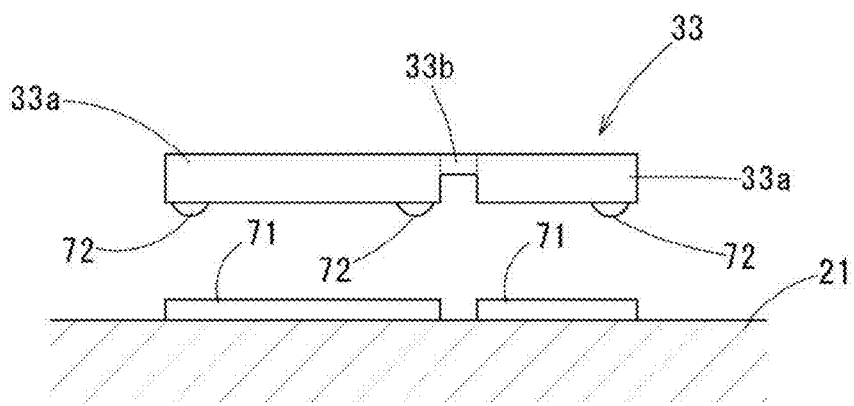
FIG. 8 is a partially-sectional front view schematically showing a middle state of piling the copper-circuit plates in FIG. 7 on bonding-material layers on a ceramic plate.

FIG. 7 and FIG. 8 show a second embodiment of the present invention. Common elements to that of the above-mentioned first embodiment are denoted by the same reference symbols and briefly described.

FIG. 7 shows a copper-circuit plate 33 before bonding to the ceramic plate 21. The copper-circuit plate 33 is formed as a state in which circuit elements 33a are connected by bridge portions 33b. The bridge portions 33b are formed thinner than the circuit elements 33a and arranged on an upper surface side of the circuit elements 33a so as to form recessed portions with respect to back surfaces (bonded surfaces) of the circuit elements 33a as shown in FIG. 8.

Similarly to the copper-circuit plate laminating step in the above-mentioned first embodiment, the temporal-stick material 72 including polyethylene glycol as a major ingredient is adhered to a back surface of the copper-circuit plate 33 in advance, and the copper-circuit plate 33 is temporarily bonded to the bonding-material layer 71 on the ceramic plate 21. The bonding-material layers 71 of the ceramic plate 21 are also formed to follow shapes and positions of the circuit elements 33a of the copper-circuit plates 33.

Similarly to the first embodiment, performing the copper-circuit plate bonding step, the heat-radiation plate bonding step, and the dividing step; and furthermore, an etching process is performed after the copper-circuit plate bonding step in order to remove the bridge portions 33b of the copper-circuit plate 33. Since the bridge portions 33b are spaced from the surface of the ceramic plate 21 and not bonded on the surface, it is easy to remove the bridge portions 33b by the etching process.

Even though the copper-circuit plate 33 includes the circuit elements 33a as in this embodiment, it is possible to laminate the ceramic plate 21 and the copper-circuit plates 33 in a state of being accurately positioned by the temporal-stick material 72 including polyethylene glycol as the major ingredient, so that it is easy to handle. Moreover, the bonding material 71 is prevented from sliding, so that it is possible to obtain the copper-circuit plate in which disused parts are reliably removed.

Figure 9:
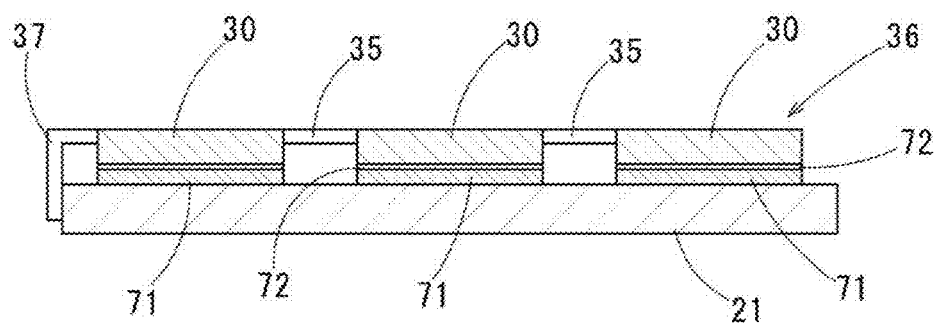
FIG. 9 is a sectional view schematically showing a state in which copper-circuit plates are piled on a ceramic plate with engaging the ceramic plate and a positioning piece formed on one of the copper-circuit plates in a third embodiment according to the present invention.

FIG. 9 shows a third embodiment. In this embodiment: a copper-circuit plate constituent 36 in which the copper-circuit plates 30 are connected by bridge portions 35 is formed; and positioning pieces 37 being bent in right angle is provided at an end part of the copper-circuit plate constituent 36. When the copper-circuit plates 30 are laminated on the ceramic plate 21 in the copper-circuit plate laminating step, the positioning pieces 37 are in contact with side surfaces of the ceramic plate 21, so that the copper-circuit plates 30 of the copper-circuit plate constituent 36 and the ceramic plate 21 are positioned together. In this case, the two positioning pieces 37 are provided at two positions so as to be in contact with two sides orthogonally crossing at a corner of the ceramic plate 21.

After laminating the copper-circuit plate constituent 36 on the ceramic plate 21, similarly to the first embodiment, the copper-circuit plate bonding step, the heat-radiation plate bonding step, and the dividing step are performed so that the power-module substrate is manufactured. In the middle of these steps, the bridge portions 35 of the copper-circuit plate constituent 36 and the positioning piece 37 are removed by an etching process or the like.

EXAMPLES

On a copper-circuit plate of 31 mm square and a thickness of 2 mm, temporal-stick material of polyethylene glycol having a weight-average molecular of 1,000 was dripped. On a ceramic substrate made of aluminum nitride of 33 mm square and a thickness of 0.635 mm, a bonding-material layer of Ag-8.8% by mass of Ti were formed. These were laminated, pressurized in vacuo of $1 \times 10^{-3}$ Pa with pressure of 10 N/cm$^2$ (1 kgf/cm$^2$) to 334 N/cm$^2$ (35 kgf/cm$^2$), and heated for 30 minutes at 850° C.

One on which the temporal-stick material was adhered in dot-shape and the other on which the temporal-stick material was spread on a whole surface of the copper-circuit plate were evaluated in bonding states. The evaluation was performed by observing existence of unbonded parts at the bonded surfaces by an ultrasonic image measuring device. Additionally, conventional examples in which the temporal-stick material was not used were made.

Figure 10:
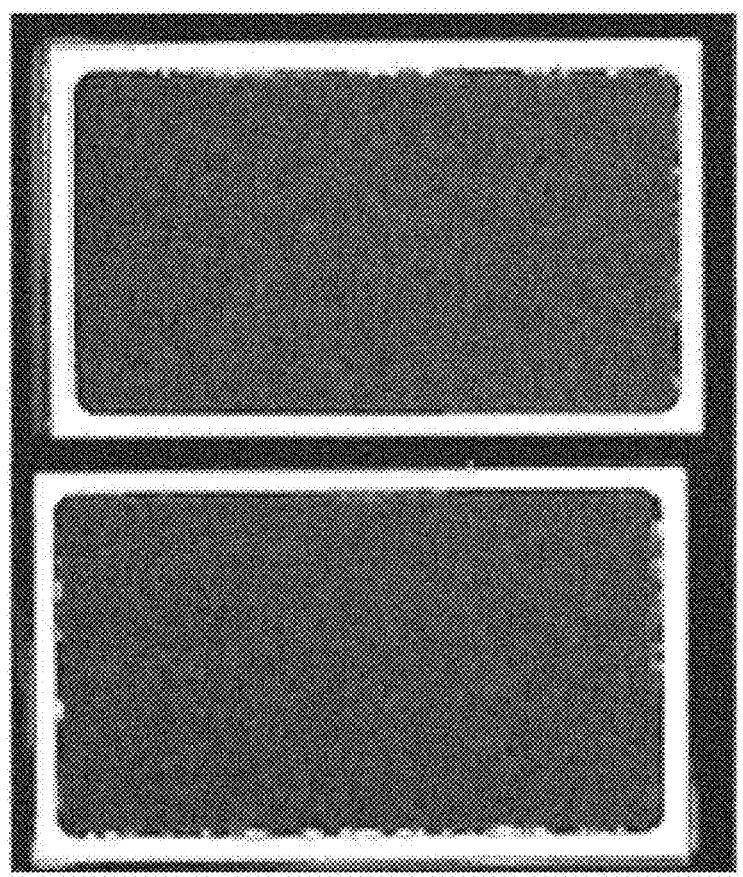
FIG. 10 is an image of bonded surfaces measured by ultrasonic in a conventional example.
Figure 11:
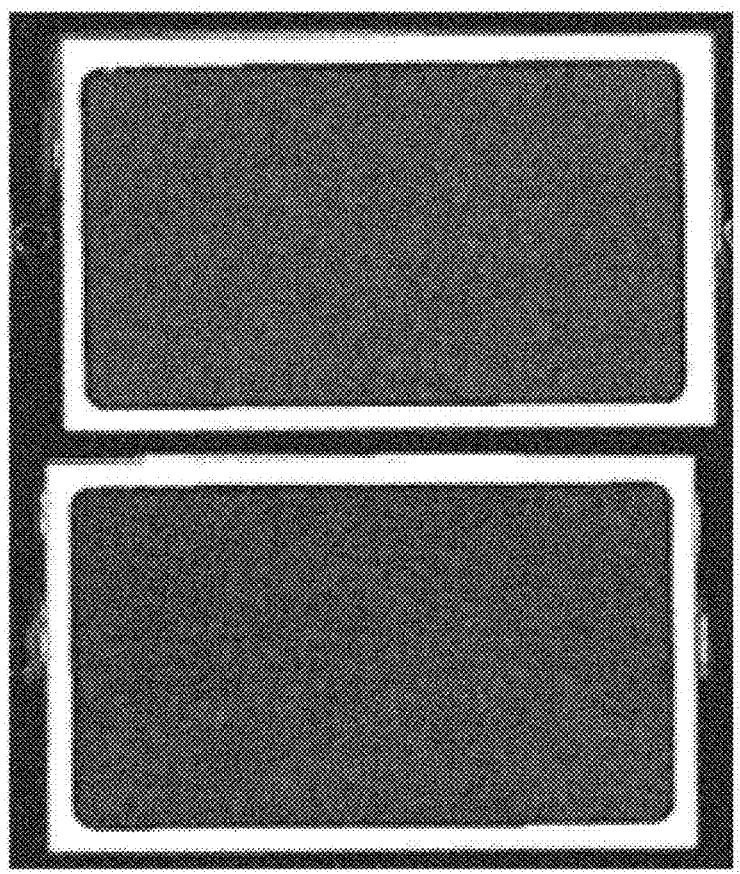
FIG. 11 is an image of bonded surfaces measured by ultrasonic in a case in which temporal-stick material is adhered in a dot-shape on a copper-circuit plate in an example of the present invention.
Figure 12:
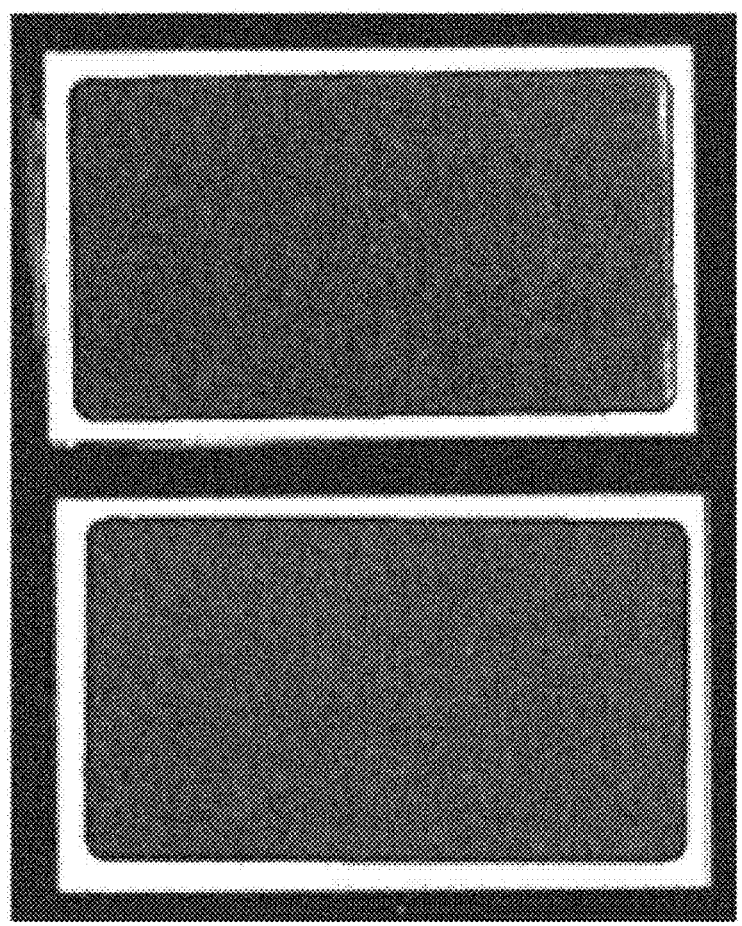
FIG. 12 is an image of bonded surfaces measured by ultrasonic in a case in which temporal-stick material is adhered on a whole surface of a copper-circuit plate in an example of the present invention.

FIG. 10 shows the conventional example in which the temporal-stick material was not used. FIG. 11 shows the examples in which the temporal-stick material was adhered in dot-shape of a diameter 3 mm to 4 mm at four corners of the copper-circuit plates. FIG. 12 shows the examples in which the temporal-stick material was spread on the whole surfaces of the copper-circuit plates. Applied quantities of the temporal-stick material were: 6.9 mg to 9.2 mg in total in FIG. 11; and 37.3 mg to 41.5 mg in total in FIG. 12.

In these drawings, black square parts are the bonded surfaces, and white parts are unbonded parts. Ones in which the temporal-stick material was used had clear outlines. Accordingly, it can be found that the bondability was not influenced even though the temporal-stick material was used.

Next, evaluation of using polyethylene glycol (PEG), cyanoacrylate-based instant glue (3000RX) made by Cemedine Co., LTD., a resin sheet (BR 101) made by Mitsubishi Rayon Co., LTD., glycerol, and liquid paraffin as the temporal-stick material were performed.

With respect to the bonded bodies obtained by using these temporal-stick materials, laminating the copper-circuit plates on the bonding-material layers on the ceramic plate, and pressurizing and heating in vacuo, evaluation was performed for a side slide, paste separation, and Cu/AlN bondability.

The side slide was evaluated by confirming with eyes whether the copper-circuit plate laminated on the bonding layer of the ceramic plate with adhering the temporal-stick material on the copper-circuit plate was slid or not when the ceramic plate was shaken left and right at a speed of about 30 mm/s after cooling. Symbols "∘" denote one in which the side slide was not found; and symbols "x" denote one in which the side slide was found.

The paste separation was evaluated by confirming with eyes whether the separation was occurred or not by dissolving the Ag—Ti paste in the bonding-material layer by reaction with the temporal-stick material after laminating the copper-circuit plate on the bonding-material layer. Symbols "∘" denote one in which the paste separation was not found; and symbols "x" denote one in which the paste separation was found.

The Cu/AlN bondability was evaluated by observing existence of an unbonded part in the bonded surface in an initial state after bonding and after a state in which cooling/heating cycles were applied 3,000 times between −40° C. and 100° C. by the above-mentioned ultrasonic image measuring device. Symbols "∘" denote one in which the unbonded part of 2% or more was not found in the bonded surface; symbols "x" denote one in which the unbonded part of 5% or more or a void of 2 mm diameter or larger was found in the bonded surface; and symbols "Δ" denote one in which a small unbonded part not corresponded to either was found in the bonded surface. These results are shown in FIG. 13.

As shown in FIG. 13, in the method of the present examples, the side slide was not occurred between the ceramic plate and the copper-circuit plates since the ceramic plate and the copper-circuit plates were laminated using the temporal-stick material, so it was found that the later handling workability was excellent. Moreover, there was no bad influence such as separation of the bonding-material layers, and it is possible to obtain the bonded surface with high reliability.

The present invention is not limited to the above-described embodiments and various modifications may be made without departing from the scope of the present invention. In the embodiments, the temporal-stick material including polyethylene glycol as the major ingredient was adhered on the copper-circuit plates, and the bonding-material layers of the active-metal brazing material were formed on the ceramic plate. Conversely, the temporal-stick material may be adhered on the ceramic plate; and the bonding-material layers may be formed on the copper-circuit plates. Furthermore, The bonding-material layers 71 of the above embodiments may be formed by using an active-metal brazing foil.

INDUSTRIAL APPLICABILITY

The present invention can be applied to a power-module substrate and a power module used for a semiconductor device controlling a large electric current and high voltage.

DESCRIPTION OF REFERENCE SYMBOLS 10 power-module substrate
20 ceramic substrate
21 ceramic plate 30 copper-circuit plate
35 copper-circuit plate
35a circuit element
35b bridge portion
40 heat-radiation plate
50 heat sink
60 electronic component
61 soldering layer
71 bonding-material layer
72 temporal-stick material
80 cover plate
90 groove
100 positioning tool
101 recessed portion
102 guide wall

What is claimed is:

1. A manufacturing method of power-module substrate wherein a plurality of copper-circuit plates are bonded at intervals on a ceramic plate having an area wherein ceramic substrates can be formed abreast, and then the ceramic plate is divided between the copper-circuit plates so as to manufacture the power-module substrates, comprising:

a laminating step of forming bonding-material layers of active-metal brazing material having same shapes as outer shapes of the copper-circuit plates on one of the ceramic plate or the plurality of copper-circuit plates, spreading temporal-stick material including polyethylene glycol as a major ingredient in a melted state by heating to a temperature at which polyethylene glycol is melted on the other of the ceramic plate or the plurality of copper-circuit plates, and temporary sticking the bonding-material layers and the copper-circuit plates in a state of laminating with positioning on the ceramic plate by cooling the temporal-stick material to a temperature at which polyethylene glycol becomes solid; and a bonding step of bonding the ceramic plate and the copper-circuit plates by pressurizing and heating a laminated assembly thereof in a laminating direction.

2. The manufacturing method of power-module substrate according to claim 1, wherein:

the bonding-material layers are formed by spreading a paste on a surface of the ceramic plate; and the copper-circuit plates in which the temporal-stick material is spread are laminated respectively on the bonding-material layers on the ceramic plate in the laminating step.

3. The manufacturing method of power-module substrate according to claim 1, wherein at least one or more of the copper-circuit plates are formed by connecting circuit elements by bridge portions, and back surfaces of the bridge portions are formed as recessed portions from back surfaces of the circuit elements.

4. The manufacturing method of power-module substrate according to claim 2, wherein at least one or more of the copper-circuit plates are formed by connecting circuit elements by bridge portions, and back surfaces of the bridge portions are formed as recessed portions from back surfaces of the circuit elements.

* * * * *